(12) United States Patent
Bao et al.

(10) Patent No.: US 9,105,638 B2
(45) Date of Patent: Aug. 11, 2015

(54) VIA-FUSE WITH LOW DIELECTRIC CONSTANT

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Fishkill, NY (US); Ronald G. Filippi, Wappingers Falls, NY (US); Wai-Kin Li, Hopewell Junction, NY (US); Naftali E. Lustig, Croton on Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/076,333

(22) Filed: Nov. 11, 2013

(65) Prior Publication Data

US 2015/0130018 A1    May 14, 2015

(51) Int. Cl.
*H01L 23/525* (2006.01)
*H01L 21/768* (2006.01)
*H01L 23/522* (2006.01)

(52) U.S. Cl.
CPC ...... *H01L 23/5256* (2013.01); *H01L 21/76879* (2013.01); *H01L 21/76886* (2013.01); *H01L 23/5226* (2013.01)

(58) Field of Classification Search
CPC ................. H01L 23/5252; H01L 23/5256
USPC ........................................ 438/601, 467, 637
See application file for complete search history.

(56) References Cited

U.S. PATENT DOCUMENTS

| | | | |
|---|---|---|---|
| 8,298,943 B1 | 10/2012 | Arnold et al. | |
| 8,329,515 B2 | 12/2012 | Yang et al. | |
| 8,421,186 B2 | 4/2013 | Li et al. | |
| 2008/0122109 A1 | 5/2008 | Yang et al. | |
| 2008/0220608 A1 | 9/2008 | Clevenger et al. | |
| 2008/0237868 A1 | 10/2008 | Clevenger et al. | |
| 2008/0296728 A1* | 12/2008 | Yang et al. | 257/530 |
| 2009/0045388 A1 | 2/2009 | Clevenger et al. | |
| 2011/0254121 A1* | 10/2011 | Cheng et al. | 257/530 |
| 2012/0118619 A1 | 5/2012 | Booth, Jr. et al. | |
| 2012/0286390 A1* | 11/2012 | Wu et al. | 257/529 |
| 2012/0326269 A1 | 12/2012 | Bonilla et al. | |
| 2013/0214894 A1* | 8/2013 | Bonilla et al. | 337/290 |

OTHER PUBLICATIONS

Bao et al., "A BEOL Multilevel Structure with Ultra Low-k Materials (k ≤ 2.4)", 978-1-4244-7678-7/10, copyright 2010 IEEE.
Beunder et al., "A New Embedded NVM Technology for Low-Power, High Temperature, Rad-Hard Applications", 0-7803-9408-9/05, copyright 2005 IEEE.

(Continued)

*Primary Examiner* — Mamadou Diallo
(74) *Attorney, Agent, or Firm* — Catherine Ivers; Hoffman Warnick LLC

(57) ABSTRACT

In an embodiment of the present invention, a semiconductor device comprises a non-fuse area that has a non-fuse via, a non-fuse line, and a non-fuse dielectric stack. The semiconductor device further comprises a fuse area that has a fuse via, a fuse line, and a fuse dielectric stack. The fuse dielectric stack comprises at least a first dielectric and a second dielectric material. The fuse via is at least partially embedded in the first dielectric material and the fuse line is embedded in the second dielectric material.

10 Claims, 4 Drawing Sheets

(56) References Cited

OTHER PUBLICATIONS

Grill, "Porous pSiCOH Ultralow-k Dielectrics for Chip Interconnects Prepared by PECVD", Annual Review of Materials Research, vol. 39: 49-69 (Volume publication date Aug. 2009).

Kothandaraman et al., "Electrically Programmable Fuse (eFUSE) Using Electromigration in Silicides",0741-3106/02, copyright 2002 IEEE.

Takaoka et al., "A Novel Via-fuse Technology Featuring Highly Stable Blow Operation with Large On-off Ratio for 32nm Node and Beyond",1-4244-0439-X/07, copyright 2007 IEEE.

Wikipedia, "Via (electronics)", retrieved on Oct. 30, 2013 from website: http://en.wikipedia.org/w/index.php?title=Via_(electronics).

* cited by examiner

VIA-FUSE WITH LOW DIELECTRIC CONSTANT

BACKGROUND

The present disclosure relates generally to the field of semiconductor devices and methods for fabrication, and more particularly to semiconductor via-fuses that have predictable fail locations. Semiconductor device fabrication is a multi-step process involving front-end-of-line (hereinafter "FEOL") processing wherein the formation of individual devices, such as transistors, directly in a silicon wafer occurs and back end of line (hereinafter "BEOL") processing wherein individual devices, for example, transistors, with wiring on the silicon wafer. BEOL generally begins when the first layer of metal wiring is deposited on the silicon wafer.

An electrical fuse (hereinafter "efuse") is a common one time programmable device. Horizontal efuses are typically formed in the FEOL with a silicided gate polycrystalline silicon electrode material. Vertical efuses are typically formed in the BEOL using the same interconnection materials (lines and vias) as non-fuse areas. Efuses can be programmed to increase their resistance compared to unprogrammed efuses, which remain in a low resistance state. Programming is accomplished by controlling electromigration (hereinafter "EM") of the fuse link from the anode to the cathode by one time complementary metal-oxide semiconductor activation. Ideally, a vertical e-fuse will blow in the via, however, current vertical efuse structures have unpredictable fail locations, which can affect the repeatability and reliability of BEOL via-fuse structures.

SUMMARY

Embodiments for the present invention provide a semiconductor device and methods for In an embodiment of the present invention, a semiconductor device comprises a non-fuse area that has a non-fuse via, a non-fuse line, and a non-fuse dielectric stack. The semiconductor device further comprises a fuse area that has a fuse via, a fuse line, and a fuse dielectric stack. The fuse dielectric stack comprises at least a first dielectric and a second dielectric material. The fuse via is at least partially embedded in the first dielectric material and the fuse line is embedded in the second dielectric material.

DETAILED DESCRIPTION

The present disclosure relates generally to the field of semiconductor devices and methods of fabrication, and more particularly to vertical electrical fuses that have predictable fail locations. The invention described herein is directed to vertical efuses having predictable locations where voids may form. Specifically, the invention described herein utilizes porous dielectric material proximate to the via of the fuse, which leads to at least one of a weak mechanical environment, poor heat dissipation, and weak liner coverage which promotes EM failure and subsequent void formation.

Structure

Figure 1A:
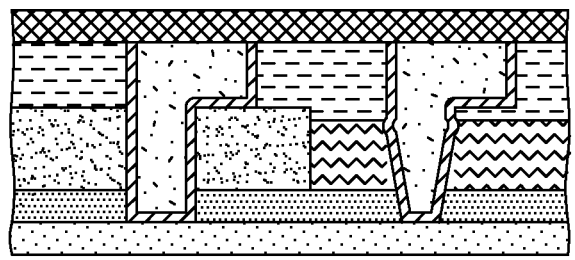
FIG. 1A illustrates a BEOL having a fuse and non-fuse, in accordance with an embodiment of the present invention.

FIG. 1A illustrates a BEOL having a fuse and non-fuse area, in accordance with an embodiment of the present invention. Referring to the fuse area, the via portion thereof is partially formed in porous low-K dielectric material that has a lower dielectric constant compared to the low-K dielectric material that the line portion of the efuse is formed in. This is in contrast to typical non-fuse areas in which, if there is a different material in the via and line portions of the fuse, the line portion will have the lower-k material. Here, in the efuse portion of the BEOL, the lower-k of the via portion relative to the line portion has several advantages. First, the lower mechanical strength of the porous low-k material relative to the higher-K material aids in blowing the fuse. Second, the porous lower-k material will likely etch faster than the higher-K material of the line portion, which will result in a bowing out (wider) fuse, which will cause the liner coverage to be poor and aid in the blowing of the fuse.

Still referring to FIG. 1A, referring to the non-fuse area, the via portion thereof is formed in dense material that has a higher dielectric constant compared to the dense material that the line portion is formed in. However, the via and line portions can include the same dense material.

Method

Figure 1B:
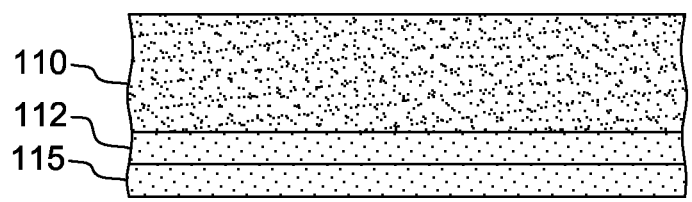
FIG. 1B depicts fabrication steps, in accordance with an embodiment of the present invention.

FIGS. 1B-5 describe an embodiment for fabricating the vertical efuse of FIG. 1A. FIG. 1B depicts additional fabrication steps, in accordance with an embodiment of the present invention. Referring to FIG. 1B, capping layer 112 is deposited on substrate 115, which includes insulator dielectric material, such as organosilicate. Capping layer 112 includes insulator material, such as silicon nitride. First dielectric 110 is deposited on substrate 115 using an appropriate deposition process, such as physical vapor deposition (hereinafter "PVD"), plasma assisted chemical vapor deposition (hereinafter "PACVD"), chemical vapor deposition (hereinafter "CVD"), electrochemical deposition (hereinafter "ED"), molecular beam epitaxy (hereinafter "MBE"), or atomic layer deposition (hereinafter "ALD"). In an embodiment, first dielectric 110 is deposited on substrate 115 with a thickness comparable to the height of the via portion of the via-fuse (discussed below). In another embodiment, first dielectric 110 is a dense dielectric that includes a porogen, such as porous organosilicate, organosilicate or octamethylcyclotetrasiloxane. In certain embodiments, first dielectric 110 has a dielectric constant in the range of about less than 4.0 to about 2.0. Excess first dielectric 110 is removed utilizing an appropriate removal process, such as wet or dry etching and/or chemical-mechanical planarization.

Figure 2:
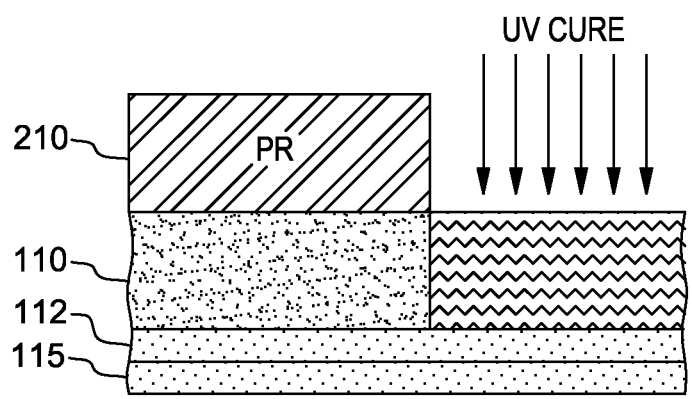
FIG. 2 depicts additional fabrication steps, in accordance with an embodiment of the present invention.

FIG. 2 depicts additional fabrication steps, in accordance with an embodiment of the present invention. Photoresist 210 is deposited on areas of first dielectric 110, for example, by a high speed spinning, that are not to have increased porosity undergo porous conversion. Photoresist 210 can be an ultraviolet (hereinafter "UV") light resistant material. UV radiation is applied to the resulting structure to increase the porosity of exposed areas of first dielectric 110 by interacting with the included porogen. Subsequent to UV application, photoresist 210 is removed, for example, by chemical mechanical polishing, an appropriate chemical solution, or oxygen plasma etching.

Figure 3:
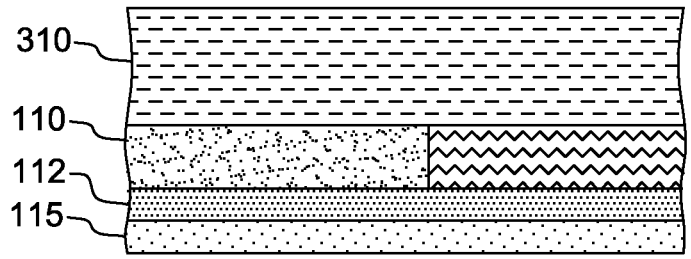
FIG. 3 depicts additional fabrication steps, in accordance with an embodiment of the present invention.

FIG. 3 depicts additional fabrication steps, in accordance with an embodiment of the present invention. Excess first dielectric 110 can be removed, for example, by chemical-mechanical planarization (hereinafter "CMP"). In an embodiment, excess first dielectric 110 is removed such that the UV exposed portion of first dielectric 110 is co-planar with the non-UV exposed portion thereof. In another embodiment, excess first dielectric 110 is removed such that the UV exposed portion of first dielectric 110 is not co-planar with the non-UV exposed portion thereof. Second dielectric 310 is deposited on first dielectric 110 using an appropriate deposition technique (discussed above). Second dielectric 310 is a low-K dielectric material, such as silicon dioxide and polyamide. In an embodiment, first dielectric 110 and second dielectric 310 include the same low-K dielectric material. In another embodiment, first dielectric 110 and second dielectric 310 include different low-K dielectric material. In other embodiments, first dielectric 110 has a lower dielectric constant compared to second dielectric 310.

Figure 4:
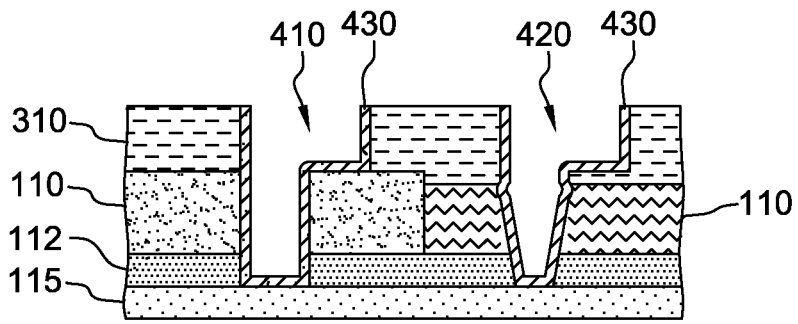
FIG. 4 depicts additional fabrication steps, in accordance with an embodiment of the present invention.
Figure 5:
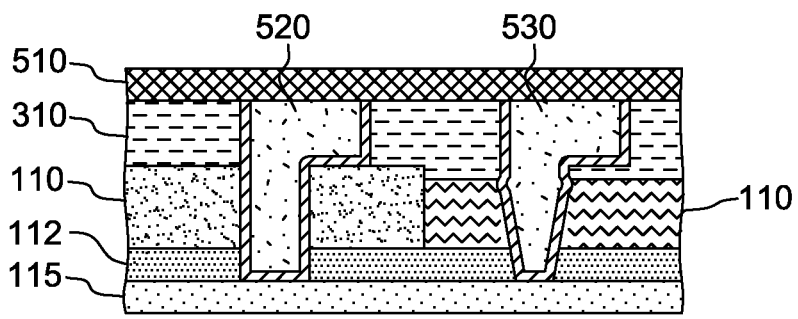
FIG. 5 depicts additional fabrication steps, in accordance with an embodiment of the present invention.

FIG. 4 depicts additional fabrication steps, in accordance with an embodiment of the present invention. Specifically, FIG. 4 depicts a metal patterning process, for example, a dual damascene patterning, performed by conventional lithography and etching techniques. Dual damascene patterning is characterized by patterning vias and trenches (also referred to as "lines") in such a way that the metal deposition fills both at the same time. The metal patterning results in damascene trenches 410 and 420, which both traverse first dielectric 110 and second dielectric 310. The pattering also results in barrier layers 430, which include barrier materials, such as tantalum, tantalum-nitride, titanium-nitride, and titanium-tungsten. Barrier layers 430 are deposited using an appropriate deposition process, such as sputter deposition. FIG. 5 depicts additional fabrication steps, in accordance with an embodiment of the present invention. Metal layers 520 and 530, which include conductive material, such as copper, is deposited in damascene trenches 410 and 420 using an appropriate deposition technique, such as electroplating.

Capping layer 510 is deposited on second dielectric 310 using an appropriate deposition technique (discussed above). In an embodiment, capping layer 510 includes insulator material, such as silicone nitride.

Structure

Figure 6A:
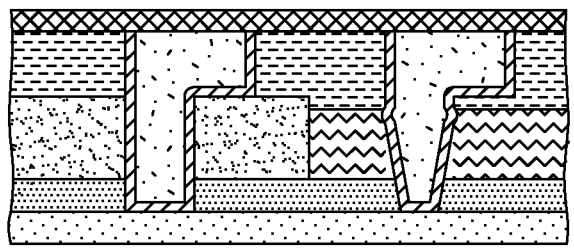
FIG. 6A illustrates a BEOL having a fuse and non-fuse area, in accordance with an embodiment of the present invention.

FIG. 6A illustrates a BEOL having a fuse and non-fuse area according to an embodiment of the present invention. Referring to the fuse area, the via portion thereof is partially formed in low-K dielectric material and porous low-k dielectric material, wherein the porous low-K dielectric material has a lower dielectric constant compared to the low-K dielectric material that the line portion of the efuse is formed in. This is in contrast to typical non-fuse areas in which, if there is a different dielectric material in the via and line portions of the fuse, the line portion will have the lower-K dielectric material. Here, in the efuse portion of the BEOL, the lower-k of the via portion relative to the line portion has several advantages.

First, the lower mechanical strength of the porous low-K dielectric material relative to the higher-K dielectric material aids in blowing the fuse. Second, the porous lower-K dielectric material will likely etch faster than the higher-K dielectric material of the line portion, which will result in a bowing out (wider) fuse, which will cause the liner coverage to be poor and aid in the blowing of the fuse. Still referring to FIG. B, as per the non-fuse are, the via portion thereof is formed in dense dielectric material that has a higher dielectric constant compared to the dense dielectric material that the line portion is formed in. However, the via and line portions can include the same dense dielectric material.

Method

Figure 6B:
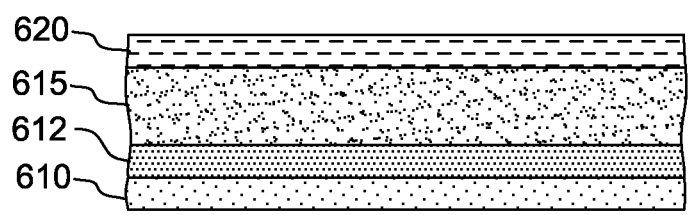
FIG. 6B depicts additional fabrication steps, in accordance with an embodiment of the present invention.

FIGS. 6B-12 describe an embodiment for fabricating the vertical efuse of FIG. 6A. FIG. 6 depicts additional fabrication steps, in accordance with an embodiment of the present invention. Referring to FIG. 6, capping layer 612 is deposited on substrate 610 using an appropriate deposition process (discussed above). First dielectric 615 is deposited on capping layer 612 utilizing an appropriate deposition process (discussed above). In an embodiment, first dielectric 615 is deposited on substrate 610 to a thickness comparable to the height of the via of the via-fuse structure (discussed below). In an embodiment, first dielectric 615 is a low-K dielectric material. Hard mask 620 is deposited on first dielectric 615 by an appropriate deposition process.

Figure 7:
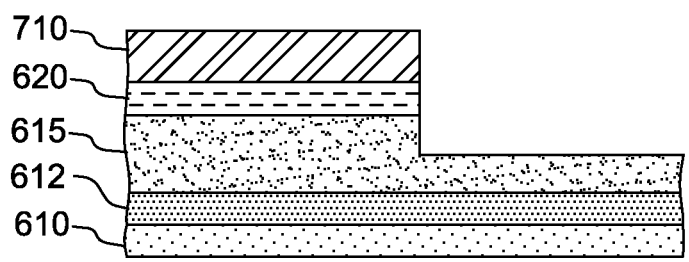
FIG. 7 depicts additional fabrication steps, in accordance with an embodiment of the present invention.
Figure 8:
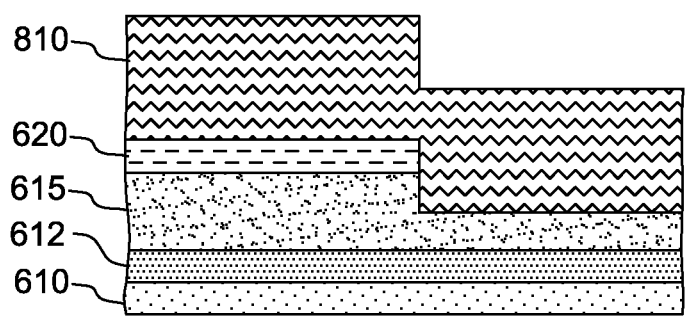
FIG. 8 depicts additional fabrication steps, in accordance with an embodiment of the present invention.

FIG. 7 depicts additional fabrication steps, in accordance with an embodiment of the present invention. Photoresist 710 is deposited on non-porous portions of hard mask 620 by, for example, high speed spinning. Areas of hard mask 620 not covered by photoresist 710 correspond to porous areas of the structure that will include a via-fuse (hereinafter "via-fuse area"). The via-fuse area is patterned and/or etched out by, for example, an etch using hydrofluoric acid. FIG. 8 depicts additional fabrication steps, in accordance with an embodiment of the present invention. Photoresist 710 is removed using an appropriate removal process using, for example, an appropriate chemical solution or an oxygen plasma system. Second dielectric 810 is deposited on hard mask 620 and first dielectric 615 using an appropriate deposition method. In an embodiment, second dielectric 810 includes a porous inter-level dielectric film, such as porous organosilicate.

Figure 9:
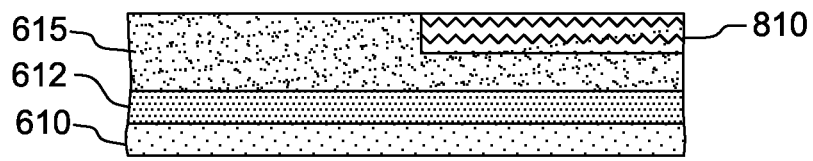
FIG. 9 depicts additional fabrication steps, in accordance with an embodiment of the present invention.
Figure 10:
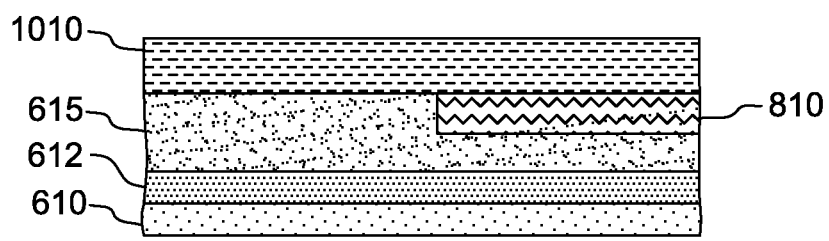
FIG. 10 depicts additional fabrication steps, in accordance with an embodiment of the present invention.

FIG. 9 depicts additional fabrication steps, in accordance with an embodiment of the present invention. Hard mask 620 and excess second dielectric 810 are removed using an appropriate removal process, for example, CMP. In certain embodiments, excess second dielectric 810 is removed such that first dielectric 615 is co-planar with second dielectric 810. In other embodiments, excess second dielectric 810 is removed such that first dielectric 615 is not co-planar with second dielectric 810. FIG. 10 depicts additional fabrication steps, in accordance with an embodiment of the present invention. Third dielectric 1010 is deposited on first dielectric 615 and second dielectric 810 to a predetermined thickness using an appropriate deposition technique. Third dielectric 1010 includes a low-K dielectric material. In an embodiment, first dielectric 615 and third dielectric 1010 are comprised of the same low-K dielectric material.

Figure 11:
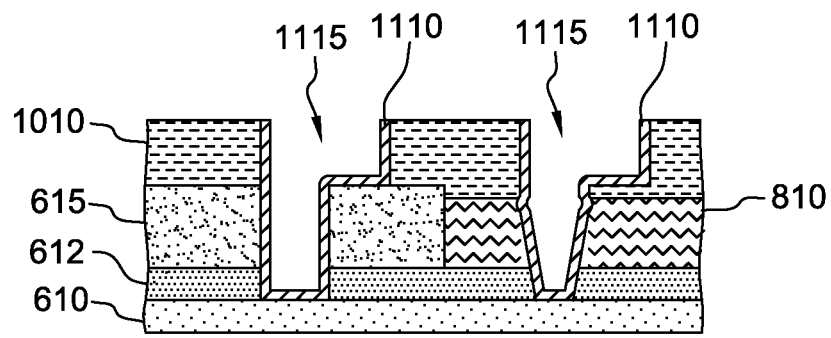
FIG. 11 depicts additional fabrication steps, in accordance with an embodiment of the present invention.

FIG. 11 depicts additional fabrication steps, in accordance with an embodiment of the present invention. Damascene trenches 1115 are formed in structure 1000 by dual damascene processing. Diffusion layers 1110 are deposited in trenches 1115 using an appropriate deposition process.

Figure 12:
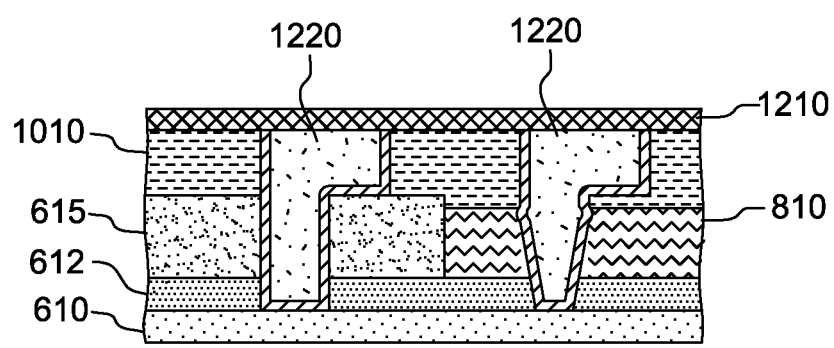
FIG. 12 depicts additional fabrication steps, in accordance with an embodiment of the present invention.

FIG. 12 depicts additional fabrication steps, in accordance with an embodiment of the present invention. Metal layers 1220 are deposited in trenches 1115 using an appropriate deposition process (discussed above). Metal layers 1220 include a conductive material, such as copper and/or aluminum. In an embodiment, excess material is removed from metal layers 1220 by an appropriate polishing method. Capping layer 1210 is deposited on third dielectric 1010 and trenches 1115 using an appropriate deposition technique. In other embodiments, capping layer 1210 includes insulator material, such as silicone nitride.

What is claimed is:

1. A method comprising:
   depositing a first dielectric material on a substrate;
   depositing a second dielectric material on the first dielectric;
   forming a fuse area in the first and second dielectric material; and
   forming a non-fuse area on the substrate at a same level as the fuse area wherein the non-fuse area has a non-fuse line and a non-fuse via;
   wherein:
   the first dielectric material has a lower dielectric constant than the second dielectric material;
   the fuse area has a fuse via and a fuse line;
   the non-fuse area has a non-fuse via and a non-fuse line;
   the fuse via is partially embedded in the first dielectric material;
   the fuse line is embedded in the second dielectric material;
   the non-fuse line is embedded in a non-fuse line dielectric material having a dielectric constant equal to or greater than the first dielectric material and equal to or less than a non-fuse via dielectric; and
   the method further comprises curing the first dielectric material to activate porogens of the first dielectric material and increase porosity of the first dielectric material.

2. The method of claim 1, wherein the first dielectric material comprises porous dielectric material or includes porogens.

3. The method of claim 1, wherein the first dielectric material is a low-k dielectric material.

4. The method of claim 1, wherein the first dielectric material is p-SiCOH or SiCOH.

5. A method comprising:
   depositing a first dielectric material on a substrate;
   depositing a second dielectric material on at least a portion of the first dielectric material;
   depositing a third dielectric material;
   forming a non-fuse area in the first and third dielectric materials that has a non-fuse via and a non-fuse line;
   forming a fuse area in the first, second, and third dielectric materials that has a fuse via and a fuse line; and wherein
   the second dielectric material has a lower dielectric constant than the first dielectric material;
   the third dielectric material has a lower dielectric constant than the first dielectric material;
   the fuse via is partially embedded in the second dielectric material; and
   the fuse line is embedded in the third dielectric material.

6. The method of claim 5, wherein the second dielectric material is porous dielectric material or includes porogens.

7. The method of claim 5, further comprising curing the second dielectric material to activate the porogens and increase the porosity of the second dielectric material.

8. The method of claim 5, wherein the first, second, and/or third dielectric material is a low-K dielectric material.

9. The method of claim 5, wherein the first and/or third dielectric material comprises p-SiCOH or SiCOH.

10. The method of claim 5 wherein the second dielectric material has the same dielectric constant as the third dielectric material.

\* \* \* \* \*